United States Patent [19]

Petty

[11] Patent Number: 4,517,475
[45] Date of Patent: May 14, 1985

[54] MASTER-SLAVE FLIP-FLOP ARRANGEMENT WITH SLAVE SECTION HAVING A FASTER OUTPUT TRANSISTION AND A GREATER RESISTANCE TO OUTPUT DEGRADATION

[75] Inventor: Cleon Petty, Tempe, Ariz.

[73] Assignee: Motorola, Inc., Schaumburg, Ill.

[21] Appl. No.: 527,065

[22] Filed: Aug. 29, 1983

[51] Int. Cl.³ .................... H03K 3/289; H03K 3/287; H03K 3/29
[52] U.S. Cl. ................................ 307/272 A; 307/456; 307/289; 307/291; 307/247 R
[58] Field of Search .......... 307/272 R, 272 A, 200 A, 307/291, 443, 299 A, 247 R, 456, 567, 549, 268; 377/115, 116

[56] References Cited

U.S. PATENT DOCUMENTS

| | | | |
|---|---|---|---|
| 3,474,263 | 10/1969 | Kalb ................................... | 307/289 |
| 3,558,931 | 1/1971 | Chernoske ........................ | 307/291 |
| 3,569,745 | 3/1971 | Kardash ............................ | 307/291 |
| 3,591,856 | 7/1971 | Kalb ................................... | 307/456 |

OTHER PUBLICATIONS

Wong, "JK Flip-Flop", IBM Tech. Bulliten, vol. 24, No. 4, Sep. 1981.

Primary Examiner—Stanley D. Miller
Assistant Examiner—Timothy P. Callahan
Attorney, Agent, or Firm—William E. Koch

[57] ABSTRACT

A TTL flip-flop having improved AC and DC characteristics is provided including a higher resistance to output degradation and quicker transition time from a high state to a low state. The flip-flop includes a master section adapted to receive a data input signal and a clock pulse and includes a first output terminal for providing a $\overline{Q}$ output signal and a second output terminal for providing a Q output signal. A slave section is coupled between the master section and output buffers for latching the Q and $\overline{Q}$ outputs. The slave section comprises first and second latch portions, each responsive to a signal from the master section and coupled to one of the output buffers. The latch portions are similar and include a first transistor having a collector coupled to one output terminal and an emitter coupled to the master section. A second transistor has a first emitter coupled to the emitter of the first transistor and a third transistor has a collector coupled to the collector of the first transistor. A fourth transistor has a collector coupled to a second emitter of the second transistor and a base coupled to an emitter of the third transistor.

4 Claims, 2 Drawing Figures

— PRIOR ART —

MASTER-SLAVE FLIP-FLOP ARRANGEMENT WITH SLAVE SECTION HAVING A FASTER OUTPUT TRANSISTION AND A GREATER RESISTANCE TO OUTPUT DEGRADATION

BACKGROUND OF THE INVENTION

1. Field of the Invention

This invention relates generally to flip-flops and, more particularly, to a TTL flip-flop having improved AC and DC characteristics including a quicker output transition from a high state to a low state and a greater resistance to output degradation.

2. Background Art

Master-slave flip-flops typically include a data gate, a master section, and a slave section. The data gate receives an input signal and provides internal signals to the master section. The master section is responsive to a clock signal and generates first and second signals. The slave section is responsive to the first and second signals for storage therein and generates traditional Q and $\overline{Q}$ outputs.

The slave section of a previously known flip-flop is shown in FIG. 1 and is also described in detail in the Detailed Description of the Invention. This previously known flip-flop comprises a latch means coupled between the master section and output buffers that provide the Q and $\overline{Q}$ outputs. The latch means includes a pair of differentially connected transistors having their collectors cross-coupled to a respective control means. Each control means comprises a first transistor having a collector connected to a base of one of the differentially connected transistors and a first emitter connected to the first signal from the master section and to a first emitter of a second transistor. The second emitters of the first and second transistors are both connected to the collector of the other differentially connected transistor. The collector of the second transistor of one control means is connected to an output buffer for providing an output.

However, this previously known circuit has certain DC and AC disadvantages. When the second transistor of the control means is off, it is possible for a leakage current through its collector to drive the output buffer causing the output to degrade, or fail to hold a constant high level. The possibility of this leakage increases as the temperature increases and is more critical at military specifications.

Furthermore, when the output switches from a high state to a low state, the diffusion capacitance of the base-emitter of the second transistor must be discharged, the base-collector capacitance of a second transistor must be charged, and the base capacitance of a transistor in the output buffer must be charged.

Therefore, what is needed is a flip-flop having an improved DC characteristic wherein the sensitivity to output degradation is reduced and an improved AC characteristic wherein the high state to low state output transition time is improved.

SUMMARY OF THE INVENTION

Accordingly, it is an object of the present invention to provide an improved flip-flop.

Another object to the present invention is to provide a flip-flop having reduced sensitivity to output degradation.

A further object to the present invention is to provide a flip-flop having an improved transition time from the high state to the low state.

In carrying out the above and other objects of the invention in one form, there is provided an improved flip-flop having a master section adapted to receive a data input signal and a clock pulse. The flip-flop includes a first output terminal for providing a $\overline{Q}$ output signal and a second output terminal for providing a Q output signal. A slave section is coupled between the first and second output terminals and the master section for latching the Q and $\overline{Q}$ output signals. The slave section comprises a first transistor having a collector coupled to one output terminal and an emitter responsive to the data input signal. A second transistor has a first emitter coupled to the emitter of the first transistor. A third transistor has a collector coupled to the collector of the first transistor and a fourth transistor has a collector coupled to a second emitter of the second transistor, and a base coupled to an emitter of the third transistor. The above and other objects, features, and advantages of the present invention will be better understood from the following detailed description taken in conjunction with the accompanying drawings.

DETAILED DESCRIPTION OF THE INVENTION

Figure 1:
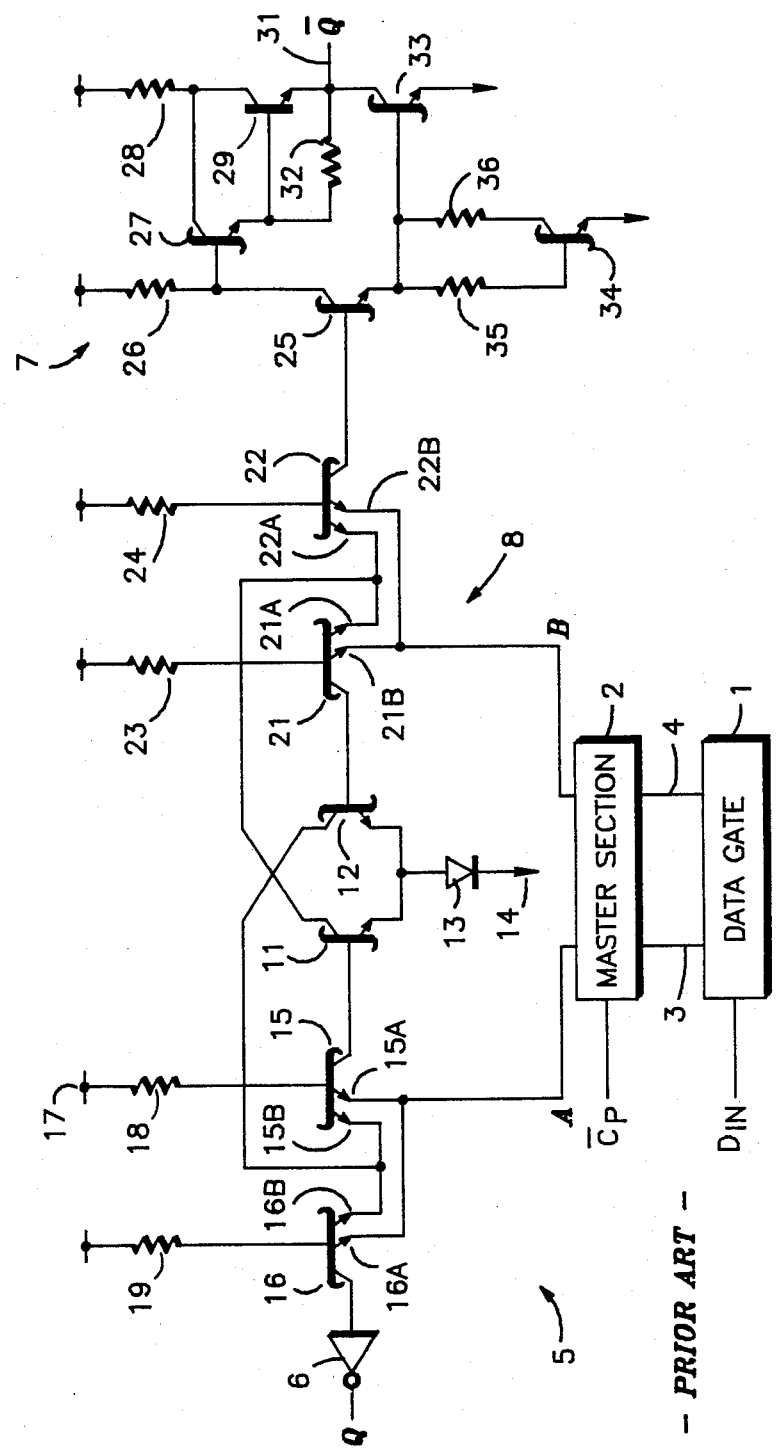
FIG. 1 illustrates in schematic form a prior art flip-flop.

Referring to FIG. 1, a previously known flip-flop is shown that includes data gate 1 which is adapted to receive a data-in signal $D_{IN}$, and master section 2 which is adapted to receive a clock pulse $\overline{C}_P$ and is coupled to data gate 1 and responsive to two internal signals on connectors 3, 4. Slave section 5 includes output buffer 6, output buffer 7 and latch 8. Output buffer 6 provides output signal Q and output buffer 7 provides output signal $\overline{Q}$. Data gate 1, master section 2 and output buffer 6 are typical circuits known to those skilled in the art and are illustrated in block diagram form for ease of description. Furthermore, output buffer 6 may be any type of output buffer including a three state gate. Output buffer 7 may also be any type of output buffer, but is illustrated schematically in order to discuss the advantages of the present invention.

Latch 8 is coupled between output buffer 6 and output buffer 7, and is responsive to signal A and signal B from master section 2. Latch 8 includes cross-coupled Schottky transistors 11, 12 having their emitters both connected to the anode of diode 13. The cathode of diode 13 is connected to supply voltage terminal 14. The base of transistor 11 is connected to the collector of multi-emitter Schottky transistor 15. Emitter 15A is connected to emitter 16A of multi-emitter Schottky transistor 16 and to signal A from master section 2. Emitters 15B and 16B are both connected to the collector of transistor 12 and the bases of transistors 15, 16 are coupled to supply voltage terminal 17 by resistors 18, 19, respectively. The collector of transistor 16 is connected to output buffer 6.

The base of transistor 12 is connected to the collector of multi-emitter Schottky transistor 21. Emitter 21B is connected to emitter 22B of multi-emitter Schottky transistor 22 and to signal B from master section 2.

Emitters 21A, 22A are both connected to the collector of transistor 11 and the bases of transistors 21, 22 are coupled to supply voltage terminal 17 by resistors 23, 24, respectively. The collector of transistor 22 is connected to the base of Schottky transistor 25 of output buffer 7.

The collector of phase splitter transistor 25 is coupled to supply voltage terminal 17 by resistor 26 and is connected to the base of Schottky transistor 27. The collector of transistor 27 is coupled to supply voltage terminal 17 by resistor 28 and is connected to the collector of upper transistor 29. The emitter of transistor 27 is coupled to output terminal 31 by resistor 32, and is connected to the base of transistor 29. The emitter of transistor 25 is connected to the base of lower Schottky transistor 33, and coupled to the base and collector of Schottky transistor 34 by resistors 35, 36, respectively. The emitter of transistors 33, 34 are connected to supply voltage terminal 14. Transistor 34 and resistors 35, 36 provide an active pull-down for the base of transistor 33. The emitter of transistor 29 is connected to output terminal 31 for supplying current thereto and the collector of transistor 33 is connected to output terminal 31 for sinking current therefrom. When current is supplied to the base of transistor 25, its collector goes low, thereby turning off transistors 27, 29. The base of transistor 33 receives current from the emitter of transistor 25, thereby causing transistor 33 to conduct and sink current from output terminal 31. When no current is supplied to the base of transistor 25, its collector goes high, causing transistors 27, 29 to conduct and output $\overline{Q}$ to go high. Since the base of transistor 33 receives no current, transistor 33 does not sink output signal $\overline{Q}$.

In order to illustrate the AC and DC advantages of the present invention, it will be necessary to describe voltage levels along certain current paths. The voltage appearing across a PN diode or base-emitter of a Schottky transistor will be referred to as $V_{BE}$ (approximately 0.75 volts). The voltage across the base-collector of a Schottky transistor will be referred to as $V_{SCH}$ (approximately 0.50 volts) and the voltage across the collector-emitter of a Schottky transistor in the active region will be referred to as $V_{SAT}$ (approximately 0.25 volts).

Assuming signals A, B from master section 2, clock pulse $\overline{C}_P$, and output signal Q are high and output signal $\overline{Q}$ is low, the operation of slave section 5 is as follows. Transistor 12 will be off with its collector high. Thus, emitters 16A, 16B are both high and current is forced through the base-collector of transistor 16 causing output signal Q to be low. Transistor 11 will be on, pulling current from emitter 22A. Therefore, current will not flow to the base of transistor 25, causing $\overline{Q}$ to be high as previously explained.

However, for no current to flow through the collector of transistor 22 to the base of transistor 25, and through the base-emitter of transistors 25, 33, the base of transistor 22 must be held at $2V_{BE}+V_{SCH}$. A path to ground less than $2V_{BE}+V_{SCH}$ is required through the emitter 22A. The current path including emitter 22A, the collector-emitter of transistor 11, and diode 13 is $2V_{BE}+V_{SAT}$. Since $V_{SAT}$ is slightly smaller than an $V_{SCH}$, the collector of transistor 22 will not conduct. However, when the current path including the collector of transistor 22 and base-emitter of transistors 25, 33 is off and current is flowing through emitter 22A, transistor 11, and diode 13, the level of emitter 22A, transistor 11, and diode 13 could become larger due to increased temperatures. Current leakage could then occur across the collector of transistor 22 to the base of transistor 25, turning on transistor 25 and causing a degradation in output $\overline{Q}$ high level period.

When the data-in signal $D_{IN}$ and clock pulse $\overline{C}_P$ go low, signal A will go low while signal B stays high. When signal A goes low, current from emitter 16A will divert current from the collector of transistor 16, causing output signal Q to go high. And emitter 15A will divert current from the collector of transistor 15, pulling away the base drive from transistor 11. With transistor 11 off, emitters 21A, 22A will go high. Since both emitters 22A, 22B are high, current will flow through the collector of transistor 22 to the base of transistor 25, causing output signal $\overline{Q}$ to go low. Likewise, current will flow through the collector of transistor 21, turning on transistor 12, pulling emitters 15B, 16B low, thereby latching the circuit.

Before the data-in signal $D_{IN}$ and clock pulse $\overline{C}_P$ go low, current flows through emitters 21A, 22A. When the current switches to the collector of transistor 22, the diffusion capacitance on the base-emitter of transistor 22 must be discharged, the base-collector capacitance of 22 must be charged, and the base capacitance of transistor 25 must be charged in order to cause $\overline{Q}$ to switch from a high state to a low state.

Figure 2:
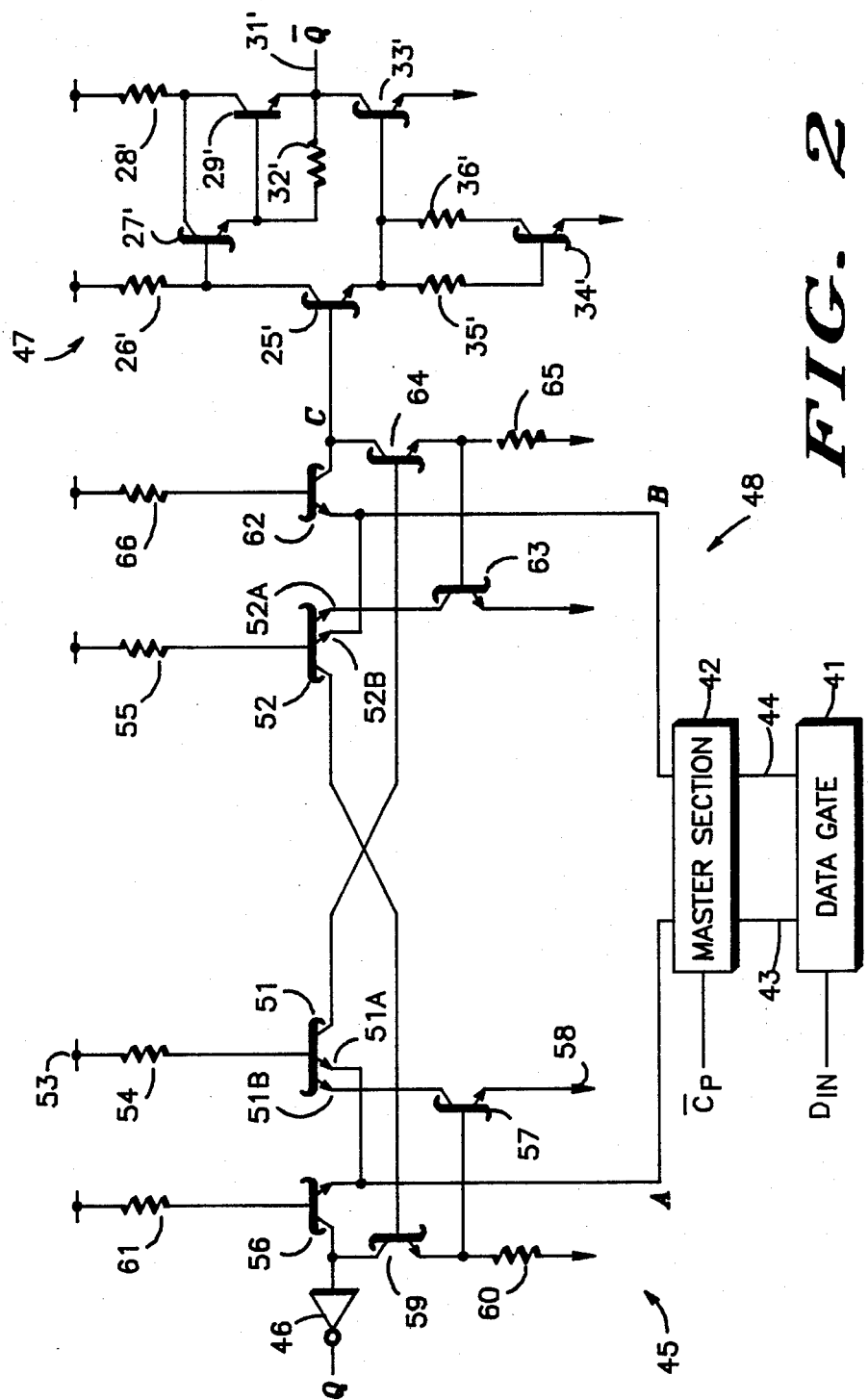
FIG. 2 illustrates in schematic form the preferred embodiment of the present invention.

Referring now to FIG. 2, the preferred embodiment of the present invention includes data gate 41 which is adapted to receive a data-in signal $D_{IN}$ and master section 42 which is adapted to receive a clock pulse $\overline{C}_P$ is coupled to data gate 41 and responsive to two internal signals on connectors 43, 44. Slave section 45 includes output buffer 46, output buffer 47, and latch 48. Output buffer 46 provides output signal $\overline{Q}$ and output buffer 47 provides output signal Q. Data gate 41, master section 42, and output buffer 46 are typical circuits known to those skilled in the art and are illustrated in block diagram form for ease of description. Output buffer 46 may be any type of buffer including a three state gate. Output buffer 47 may also be any type of output buffer, but is as illustrated in order to show the advantages of the preferred embodiment.

Latch 48 is coupled between output buffer 46 and output buffer 47, and is responsive to signal A and signal B from master section 42. Latch 48 includes multi-emitter Schottky transistors 51, 52 having their bases coupled to supply voltage terminal 53 by resistors 54, 55, respectively. Emitter 51A is connected to the emitter of Schottky transistor 56 and to signal A from master section 42. Emitter 51B is connected to the collector of Schottky transistor 57. The emitter of transistor 57 is connected to supply voltage terminal 58 and its base is connected to the emitter of transistor 59 and is coupled to supply voltage terminal 58 by resistor 60. The base of transistor 56 is coupled to supply voltage terminal 53 by resistor 61. The collectors of transistors 56, 59 are both connected to output buffer 46. The base of transistor 59 is connected to the collector of transistor 52.

Emitter 52B is connected to both the emitter of transistor 62 and to signal B from master section 42. Emitter 52A is connected to the collector of transistor 63. The emitter of transistor 63 is connected to supply voltage terminal 58 and its base is connected to the emitter of Schottky transistor 64 and is coupled to supply voltage terminal 58 by resistor 65. The base of transistor 62 is coupled to supply voltage terminal 53 by resistor 66. The collectors of both transistors 62, 64 are connected to the base of transistor 25'. The base of transistor 64 is connected to the collector of transistor 51.

Output buffer 47 of FIG. 2 is similar to output buffer 7 of FIG. 1, therefore, prime designations have been used on the numbers for ease of description. The description of the connections is given hereinabove in FIG. 1.

Assuming signals. A and B from master section 42, clock pulse $\overline{C}_P$, and output signal $\overline{Q}$ are high, and output signal Q is low, the operation of slave section 48 is as follows. For $\overline{Q}$ to be high, the base of transistor 25' must be low as previously described. The current through transistor 62 will be directed through its collector, current will flow through emitter 52A, and transistor 63, 64 will be on. Since signal A is high, the current through transistor 56 will flow through its collector to output buffer 46. Transistors 57, 59 are off and the current through transistor 51 will flow through its collector to drive the base of transistor 64.

For no current to flow through the base-emitter of transistors 25', 33', the collector of transistor 62 must be held at $2V_{BE}$, or the level of the base-emitter of transistors 25', 33'. But, the current path including the collector-emitter of transistor 64 and the base-emitter of transistor 63, or $V_{BE}+V_{SAT}$ is lower than $2V_{BE}$. Therefore, since the current path through transistor 63, 64 is approximately $V_{SCH}$, or 500 millivolts, lower than the current path including transistors 25', 33', the output can be held off with a lower level. The possibility of output degradation is substantially reduced and an active current pull-down is provided for the base of transistor 25'. Even if the collector of transistor 62 were to leak, the current would flow through transistor 64 instead of driving transistor 25' and causing degradation in output $\overline{Q}$.

When the data-in signal $D_{IN}$ and clock pulse $\overline{C}_P$ go low, signal A will go low while signal B stays high. When signal A goes low, current will flow through the base-emitter of transistor 56 and emitter 51A causing output signal Q to go high and transistor 64 to turn off. The collector of transistor 64 goes high and transistor 63 turns off with its collector going high. Therefore, current previously flowing through transistor 64 will now drive transistor 25' taking $\overline{Q}$ low. Since transistor 63 is off, its collector goes high causing the current through transistor 52 to divert through its collector, thereby turning on transistors 57, 59. Transistor 59 pulls current away from output buffer 46 and transistor 57 pulls current from emitter 51B, thereby taking current from the base of transistor 64 resulting in the latching of the circuit.

By thusly driving the base of transistor 25' the current is not switched from the emitter of transistor 62 to its collector and no diffusion capacitance needs to be discharged as required in the previously known circuit. Likewise, since current was already flowing through the collector of transistor 62, the collector capacitance is already charged as is the base capacitance of transistor 25'. Only the collector capacitance of transistor 64 need be charged.

When clock pulse $C_P$ goes high again, the new output conditions are Q high and $\overline{Q}$ low. The d.c. condition previusly described is setup with the input of output buffer 46 being held at $V_{BE}+V_{SAT}$, or approximately 500 millivolts, below the required $2 V_{BE}$ level. When data-in signal $D_{IN}$ changes the clock pulse $C_P$ goes low, signal B goes low, signal A stays high, and the a.c. condition previously described occurs at the input and output buffer 46.

Since signals A and B are not allowed to be low simultaneously in known master slave flip-flops, this condition would be invalid.

By now it should be appreciated that there has been provided a flip-flop having an improved DC characteristic wherein greater resistance to output degradation is provided and an improved AC characteristic wherein a quicker output transition from a high state to a low state is provided.

I claim:

1. A flip-flop having a master section coupled to receive a data input signal and a clock pulse signal, said flip-flop including a first output terminal for providing a $\overline{Q}$ output signal and a second output terminal for providing a Q output signal, and having a slave section coupled between said first and second output terminals and said master section, said slave section comprising:
   a first transistor having a collector to said second output terminal and an emitter coupled to said master section;
   a second transistor having a first emitter coupled to said emitter of said first transistor;
   a third transistor having a collector coupled to said collector of said first transistor;
   a fourth transistor having a collector coupled to a second emitter of said second transistor, and a base coupled to an emitter of said third transistor;
   a fifth transistor having a collector coupling to said frst output terminal and an emitter coupled to said master section;
   a sixth transistor having a first emitter coupled to said emitter of said fifth transistor and a collector coupled to a base of said third transistor;
   a seventh transistor having a collector coupled to said collector of said fifth transistor and a base coupled to a collector of said second transistor; and
   an eighth transistor having a collector coupled to a second emitter of said sixth transistor and a base coupled to an emitter of said seventh transistor.

2. The flip-flop according to claim 1 further comprising a buffer means coupled between said second output terminal and said collector of said first transistor.

3. The flip-flop according to claim 1 further comprising a buffer means coupled between said first output terminal and said collector of said fifth transistor.

4. A flip-flop comprising:
   data gate means coupled for receiving an input data signal and for generating therefrom first and second internal data signals representative of said input data signal;
   master section means coupled to said data gate means and coupled to receive a clock pulse for latching said internal data signals during a predetermined portion of said clock pulse, said master section means generating a first master signal and a second master signal; and
   slave means coupled to said master section means for generating therefrom a first output signal and a second output signal, said slave means comprising:
   a first transistor having a collector coupled for providing said first output signal and an emitter coupled to said master section and responsive to said first master signal;
   a second transistor having a first emitter coupled to said emitter of said first transistor;

a third transistor having a collector coupled to said collector of said first transistor;

a fourth transistor having a collector coupled to a second emitter of said second transistor, and a base coupled to an emitter of said third transistor;

a fifth transistor having a collector coupled for providing said second output signal and an emitter coupled to said master section and responsive to said second master signal;

a sixth transistor having a first emitter coupled to said emitter of said fifth transistor and a collector coupled to a base of said third transistor;

a seventh transistor having a collector coupled to said collector of said fifth transistor and a base coupled to a collector of said second transistor; and an eighth transistor having a collector coupled to second emitter of said sixth transistor and a base coupled couupled to an emitter of said seventh transistor.

* * * * *